United States Patent
Lee (10) Patent No.: US 9,885,763 B2
(45) Date of Patent: Feb. 6, 2018

(54) ELECTRONIC DEVICE HAVING COVER

(71) Applicant: Samsung Electronics Co., Ltd., Gyeonggi-do (KR)

(72) Inventor: June Lee, Seoul (KR)

(73) Assignee: Samsung Electronics Co., Ltd, Yeongtong-gu, Suwon-si, Gyeonggi-do (KR)

( * ) Notice: Subject to any disclaimer, the term of this patent is extended or adjusted under 35 U.S.C. 154(b) by 270 days.

(21) Appl. No.: 14/198,886

(22) Filed: Mar. 6, 2014

(65) Prior Publication Data

US 2014/0298062 A1 Oct. 2, 2014

(30) Foreign Application Priority Data

Apr. 2, 2013 (KR) .................. 10-2013-0035952

(51) Int. Cl.
*G01R 33/07* (2006.01)
*G06F 1/16* (2006.01)

(52) U.S. Cl.
CPC .......... *G01R 33/07* (2013.01); *G06F 1/1626* (2013.01); *G06F 1/1628* (2013.01); *G06F 1/1677* (2013.01); *G06F 1/1679* (2013.01); *G06F 2200/1633* (2013.01); *G06F 2200/1634* (2013.01); *Y10T 307/766* (2015.04)

(58) Field of Classification Search
CPC .... G06F 1/1628; G06F 1/1677; G06F 1/1679; G01R 33/0005; G01R 33/0047; G01R 33/02; G01R 33/07; H05K 5/03
See application file for complete search history.

(56) References Cited

U.S. PATENT DOCUMENTS

| 6,195,140 | B1 | 2/2001 | Kubo et al. |
| 2006/0135226 | A1* | 6/2006 | Won .............. G06F 1/1616 455/575.3 |
| 2009/0295975 | A1* | 12/2009 | Takahashi ........ H04N 5/23293 348/333.01 |
| 2010/0100202 | A1* | 4/2010 | Chen ................ G01R 33/02 700/75 |
| 2011/0306392 | A1 | 12/2011 | Qin et al. |
| 2012/0068919 | A1* | 3/2012 | Lauder ............. G06F 1/1656 345/156 |
| 2012/0072167 | A1* | 3/2012 | Cretella, Jr. ........ G06F 1/1626 702/150 |
| 2013/0088431 | A1* | 4/2013 | Ballagas ............ G06F 1/1626 345/168 |
| 2014/0139989 | A1* | 5/2014 | Mori ............... G06F 1/1628 361/679.09 |

FOREIGN PATENT DOCUMENTS

| EP | 2 088 446 A1 | 8/2009 |
| EP | 2 431 835 A2 | 3/2012 |
| KR | 2003-0089930 A | 11/2003 |
| KR | 10-0430873 B1 | 4/2004 |
| KR | 10-1131440 B1 | 3/2012 |

* cited by examiner

*Primary Examiner* — Dennis M Butler
(74) *Attorney, Agent, or Firm* — Cha & Reiter, LLC.

(57) ABSTRACT

An electronic device having a cover includes a cover unit rotated about one side of the electronic device and having a magnet member; a magnetic body mounted within the electronic device and magnetized by the magnet member; a sensor unit provided close to the magnetic body to sense a magnetic flux generated by the magnetic body; and a controller which executes a user experience according to a signal output of the sensor unit.

21 Claims, 8 Drawing Sheets

ELECTRONIC DEVICE HAVING COVER

CLAIM OF PRIORITY

This application claims the priority under 35 U.S.C. §119(a) from Korean Application Serial No. 10-2013-0035952, which was filed in the Korean Intellectual Property Office on Apr. 2, 2013, the entire content of which is hereby incorporated by reference.

TECHNICAL FIELD

The present disclosure relates to an electronic device, and more particularly to an electronic device including a cover for protecting the electronic device.

BACKGROUND

In recent years, various electronic devices, such as mobile phones, MP3 players, portable multimedia players (PMPs), and electronic books, have become widely used so that the users can access various content or media while the devices are being carried. Various functions such as pictures, videos, multimedia, and games as well as wireless transmission/reception of signals are often integrated in such electronic devices. A display unit is typically provided on a front surface of an electronic device so that multi-functions can be used, and an electronic device called smart phones provides a large-sized display such that the entire front surface of the electronic device responds to a touch.

However, in the electronic device, a scratch or a damage due to an impact may be generated on an outer case of the electronic device or a display unit exposed to a front side of the electronic device in the process of carrying or using the electronic device. In order to prevent the problem, electronic devices are often provided with various cases, or covers (hereinafter, referred to as 'the cover unit'). Various existing cover units for covering electronic devices exist according to the types or configurations for covering the electronic devices. For example, a cover unit whose display unit side is exposed and which covers only an outer periphery of an electronic device or a rear case is provided so that a user can directly use the display unit, and a cover unit which covers an entire electronic device through a flip type case and in which a portion covering the display unit is opened and closed to use the display unit. When the cover unit in which the display unit is exposed is used, the display unit can be directly used but a scratch may be generated in the display unit and it is difficult to prevent damage. Accordingly, in recent years, considering a design and a convenience of the cover unit, a flip type cover unit (hereinafter, referred to as 'the flip cover'), having a luxurious design is widely used. A conventional flip cover has a part for covering a display unit (hereinafter, referred to as 'the cover member') and a rear cover for covering a rear surface of an electronic device (hereinafter, referred to as 'the battery cover') integrally formed with the cover member to make the electronic device slim and realize a luxurious design. However, the cover member is provided to be simply positioned on a surface of a display unit to protect the surface of the display unit, and simply recognize only an opening/closing state of the cover unit. For example, a cover member in the form of a hard book cover (referred to as 'the quick cover') is rotatably provided on a surface of an electronic device, or is provided such that a Hall sensor can determine only existence of a magnetic flux generated by a magnet to recognize an on/off state of the book cover.

Further, since the cover member such as a book cover does not separately include a member for fixing the cover member to realize a luxurious design, the cover member cannot be fixed onto the display unit. Further, since the cover member cannot be fixed even when the cover member such as a book cover is deployed so that a user can use the display unit, for example, since a user should use the electronic device while holding the cover member on the rear surface of the electronic device, he or she feels inconvenience.

Even when a fixing unit for fixing the book cover is provided separately, only the front surface of the display unit is fixed.

Thus, as described above, when the cover member is open, a user should use the electronic device while holding the cover member. Further, since the fixing member is exposed to the outside, the luxuriousness of the design of the cover unit is lowered.

SUMMARY

The present disclosure provides an electronic device which can recognize an opened/closed state of a flip cover, in detail, a cover member and a location where a cover member is folded to a front surface or a rear surface of the electronic device, and executes a specific mode according to a location of the cover member.

The present disclosure also provides an electronic device which, when the electronic device is held through a cover member, can sense an angle or a location where the cover member is held to execute a mode suitable for the sensed result.

The present disclosure also provides an electronic device which can maintain a state in which a cover unit is fixed to a front surface and a rear surface of the electronic device while being folded to the front surface or rear surface of the electronic device, and realize a luxurious design of the cover unit.

In accordance with an aspect of the present invention, an electronic device has a cover, including: a cover unit rotatably coupled to one side of the electronic device and having a magnet member disposed therein; a magnetic body mounted within the electronic device positioned to be magnetized by the magnet member when in proximity thereof; a sensor unit located near the magnetic body to sense a magnetic flux generated by the magnetic body; and a controller configured to execute one or more functions in response to a signal output of the sensor unit.

In accordance with another aspect of the present invention, there is provided an electronic device comprising a flip cover having a rear cover coupled to a rear surface of the electronic device, a front cover rotatably connected to the rear cover to cover a display unit of the electronic device, a permanent magnet disposed in the front cover, and a connecting member connecting the rear cover and the front cover; a ferromagnetic body positioned on the electronic device to face a location of the permanent magnet to be magnetized according to a magnetism of the permanent magnet; and a Hall sensor mounted in proximity to the ferromagnetic body to sense a magnetic flux of the ferromagnetic body, wherein permanent magnet, ferromagnetic body and Hall sensor are positioned such that when the front cover is folded to the front or rear surface of the electronic device, the permanent magnet and the ferromagnetic body face each other to be held by a mutual attractive force, and the Hall sensor senses a folded location of the front cover and a held location of the electronic device through a magnetic flux according to magnetization of the ferromagnetic body.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION

Hereinafter, various embodiments of the present invention will be described with reference to the accompanying drawings. In the process, thicknesses of lines shown in the drawings and sizes of constituent elements may be exaggerated for clarity and convenience. Further, the following terms are defined, considering their functions in the present invention, and may be varied according to intentions and customs of a user or manager. Thus, the terms should be defined based on the contents of the entire specification.

Further, although ordinal numbers such as first and second are used in the description of the embodiments of the present invention, their sequence may be arbitrarily determined and the description of the preceding elements may be applied in the description of the succeeding elements.

Figure 1:
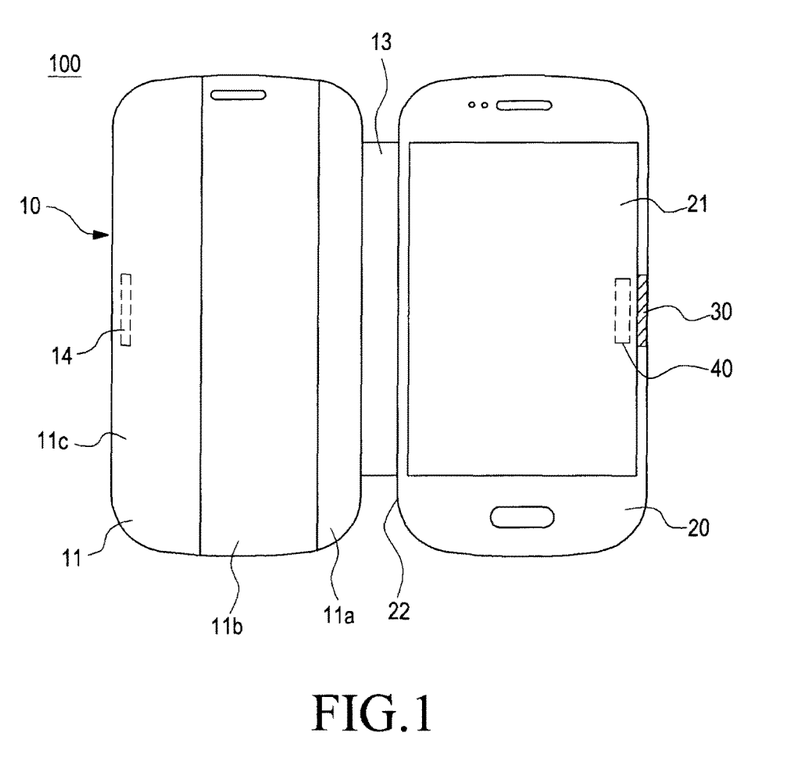
FIG. 1 is a view showing an electronic device according to an embodiment of the present invention.
Figure 2:
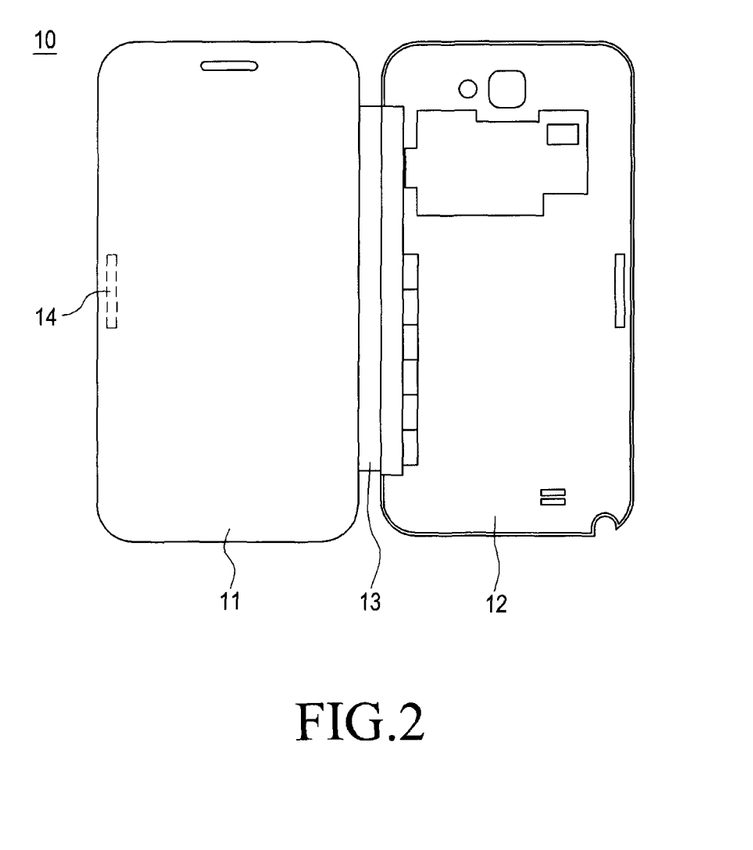
FIG. 2 is a view showing a cover unit of the electronic device of FIG. 1.

FIG. 1 is a view showing an electronic device according to an embodiment of the present invention. FIG. 2 is a view showing a cover unit of the electronic device of FIG. 1. Referring to FIGS. 1 and 2, the electronic device 100 includes a body 20, a cover unit 10 covering the body 20, a module 15 for sensing a location of the cover unit 10 (not shown) and accordingly fixing the cover unit 10 or providing a mode according to the location of the cover unit 10, in detail, a magnet member 14, a magnetic body 30, a sensor unit 40, and a controller 70 (see FIGS. 4 and 9).

A flip type cover unit (hereinafter, referred to as 'the flip cover') integrally provided in the body 20 will be exemplified as the cover unit 10 according to the embodiment of the present invention. More particularly, the cover unit 10 as shown in FIG. 2, preferably includes a rear cover 12, a front cover 11, and a connecting member 13. When joined to the device 100, the rear cover 12 is rotatably connected to the front cover 11, and provided on a rear surface of the body 20 to cover the rear surface of the body 20.

The rear cover 12 may be configured to be integrally provided in the body 20 or not integral with the body. The rear cover 12 integrally provided in the body 20 typically includes a battery cover for covering a battery provided on the rear surface of the body 20. In contrast, when the rear cover 12 is separately provided, i.e. not integral, the rear cover 12 separately covers the rear surface of the body 20 in a state in which the battery cover is provided on the rear surface of the body 20. In one embodiment of the present invention, the rear cover 12 is a battery cover (hereinafter, the rear cover 12 will be described as the battery cover 12) integrally coupled to the body 20 on the rear surface of the body 20. However, as mentioned above, since the battery cover includes a configuration integrally coupled to the body 20 as the battery cover, and a configuration for covering the rear surface of the body 20 separately from the battery cover, the rear cover 12 may be arbitrarily modified according to a type or configuration of the body 20 or a type, a configuration, or an in-use state of the cover unit. The above-described rear cover 12 provided integrally with or separately from the body 20 is most often formed of a plastic material to cover the entire battery cover detachably folded to the rear surface of the body 20, or is detachably coupled to the body 20 as a battery cover.

The front cover 11 is typically rotatably connected to one side of the rear cover 12 by the connecting member 13. As discussed above, the rear cover 12 covers the entire battery cover provided on the rear surface of the body 20 or forms a rear case of the body as a battery cover, and it will be exemplified below that the rear cover 12 is integrally provided in the body as the battery cover 12.

The front cover 11 (hereinafter, referred to as 'the cover member 11') is rotatably connected to the battery cover 12, and covers the front surface of the body 20 when joined to the device 100. More particularly, when joined to the device 100, the front cover 11 covers, the display unit 21. The cover member 11 can be folded such that it covers the front surface of the display unit 21. Typically, the cover member 11 is rotated about or by the connecting member 13, which will be described below, so that the display unit 21 can be used. In this embodiment, the cover member 11 can be folded to the rear surface of the body 20, or the battery cover 12. The inner side of the cover member 11 is preferably formed of a material such as a soft cloth, such as microfiber, such that when the inner side contacts the display unit 21 damage to the display unit 21 is avoided. The cover member 11 is typically formed to be hard by using a material such as compressed paper or compressed cloth to show luxuriousness.

Figure 8:
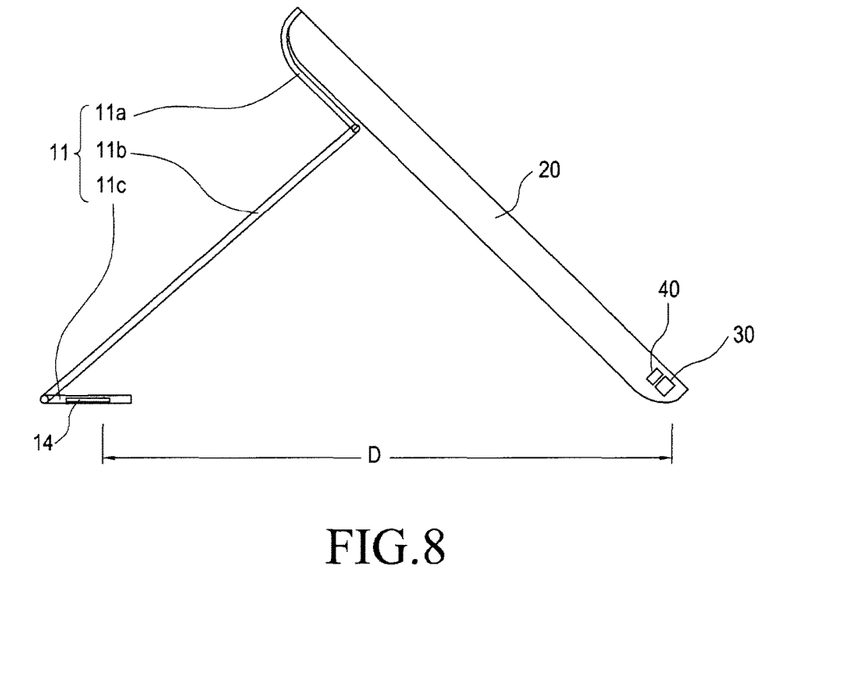
FIG. 8 is a view showing a case in which the cover member is held in the body in the electronic device of FIG. 4.

As the cover member 11 is divided into a plurality of division surfaces 11a, 11b, and 11c, the body 20 can be held after the cover member 11 is rotated (see FIG. 8). This will be described in more detail when the holding state is described. The connecting member 13 has a configuration rotatably connecting the battery cover 12 and the cover member 11, and is often formed of a soft material such as cloth. The cover unit 10 can be configured such that the battery cover 12 is coupled to the rear surface of the body 20 and the entire cover unit 10 is coupled to the body 20 at the same time.

Although a configuration in which the cover member 11 and the battery cover 12 are integrally formed will be exemplified as the cover unit 10 described in the embodiment of the present invention, the cover unit 10 is not limited thereto. For example, the cover member 11 may be rotatably coupled to a side surface 22 of the body 20 such that it can be rotated 360 degrees about the side surface 22. In this way, it is apparent that a configuration, a type, or a shape of the cover unit 10 can be arbitrarily modified. More particularly, the present invention encompasses any configuration by which the cover member 11 can be rotated by 360 degrees about the device 100, in order to cover the front or rear surface of the body 20.

Figure 3:
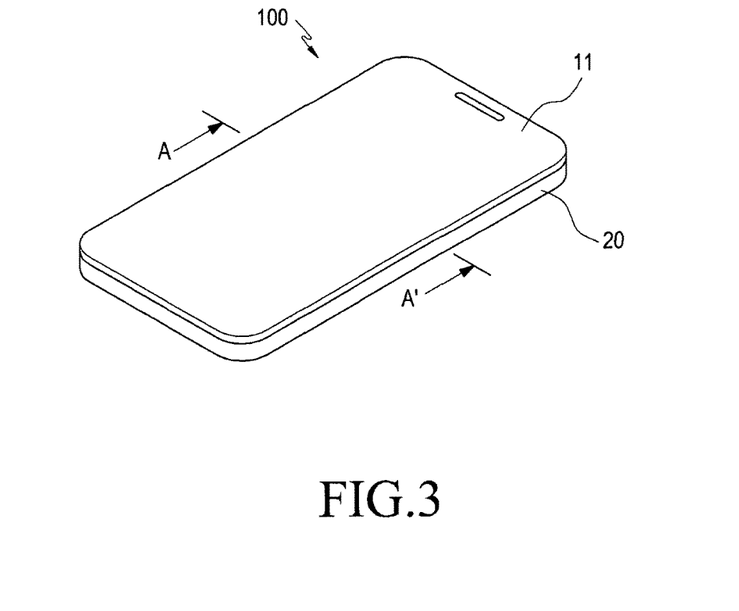
FIG. 3 is a view showing a state in which a front surface of a body is covered by the cover unit in the electronic device of FIG. 1.
Figure 4:
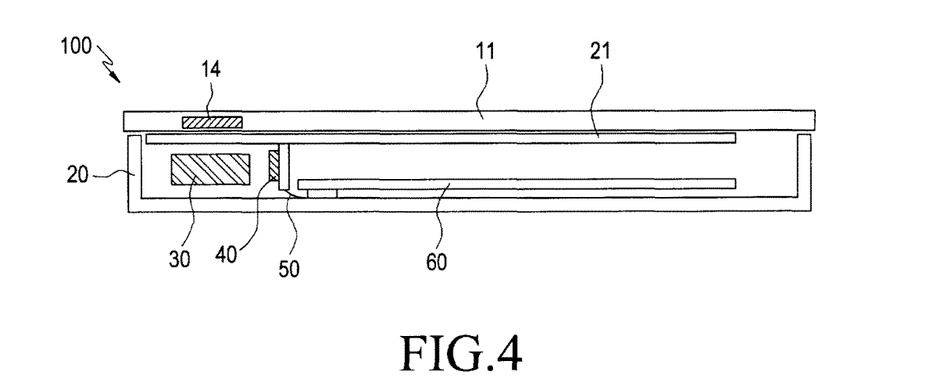
FIG. 4 is a sectional view taken along line A-A' of FIG. 3.

FIG. 3 is a view of an embodiment of the present invention where a front surface of a body is covered by the cover unit in the electronic device of FIG. 1. FIG. 4 is a sectional view taken along line A-A' of FIG. 3. Referring to FIGS. 3 and 4, the cover unit 10, more specifically, the cover member 11 contains the magnet member 14, preferably a permanent magnet. The magnet member 14 has polarities of an N pole 14a and an S pole 14b. More particularly, if the N pole 14a is formed on an inner side of the cover member 11, the S pole 14b is located on an outer side of the cover member 11, that is, a surface side of the cover member 11. Accordingly, if the S pole 14a is formed on an inner side of the cover member 11, the N pole 14b is located on an outer side of the cover member 11, that is, a surface side of the cover member 11. The magnet member 14 reacts with the magnetic body 30 provided on the inner side of the body 20 when folded to the front surface or rear surface of the body 20 to fix the cover member 11 (see FIGS. 5 and 7). More particularly, due to the configuration and location of the magnet member 14 and the magnetic body, the cover member 11 can be held in place adjacent to the front surface or the rear surface of the body 20.

The device 100 may execute various commands or functions depending upon a sensing value of the sensor unit 40. More particularly, Hall sensor 40 may provide data to the controller to perform a function in response to a magnetic flux of the magnetic body 30 reacting with the magnet member 14 as detected by the Hall sensor 40. For example, various modes such as a sleep mode M1 in the case when the body 20 is folded to the front surface of the body 20, a standby mode M2 in the case when the body 20 is folded to the rear surface of the body 20, and a stand mode M3 in which the body 20 is held. The magnet member 14 is preferably provided at a peripheral portion of the cover member 11 as shown in FIG. 1, for example, opposite of the connecting member 13.

However, the location of the magnet member 14 is not limited thereto, and any location where the magnet member 14 can react with the magnetic body 30 and the Hall sensor 40, which will be described below. This location is preferably selected to limit any influence on the display unit 21 may be chosen. More particularly, the specific location of the magnet member 14 can be changed without detracting from the invention. The more detailed contents will be described at the same time when the magnet body 30 and the Hall sensor 40 are described.

The magnetic body 30 and the sensor unit 40 are preferably provided on the inner side of the body 20 to face the magnet member 14 positioned in the cover member 11. The magnetic body 30 accordingly preferably located facing the magnet member 14 such that it can be magnetized by the magnet member 14. Due to the magnetic body 30, the magnet member 14 has different magnetic fluxes according to the location thereof, and condition of the magnetized magnetic body 30 can be sensed by the sensor unit 40. Most preferably, the sensor unit is located at a location close to the magnetic body 30 in order to detect the position of the cover member 11. As mentioned above, an attractive force is generated between the magnetic body 30 and the magnet member 14 so that the cover member 11 can be held to either a front surface or a rear surface of the body 20. In particular, the magnetic body 30 is preferably located at a periphery of the display unit 21 to be provided at a location other than the display unit 21 displaying a screen. In detail, the magnetic body 30 is preferably located at a periphery of the display unit 21 where a screen is not displayed, e.g., in a bezel area. In addition, since the connecting member 13 is located at a left side of the display unit 21 such that a left end of the cover member 11 is rotated about a right end thereof, the magnet member 14, the magnetic body 30, and the Hall sensor 40 are preferably disposed on the right end of the body 20. More particularly, the magnet member 14, the magnetic body 30 and the Hall sensor 40 are most often positioned opposite the connecting member 13. Although it has been exemplified that the magnet member 14, the magnetic body 30, and the sensor unit 40 are located on an opposite side of the connecting member 13, the present invention is not limited thereto. For example, opening/closing of the cover member 11 can be recognized while the location of the bezel does not influence the display unit 21, and any locations of the magnet member 14, the magnetic body 30, and the sensor unit 40 where the cover member 11 can be fixed to the front or rear surface of the body 20 can be arbitrarily chosen.

Figure 5A:
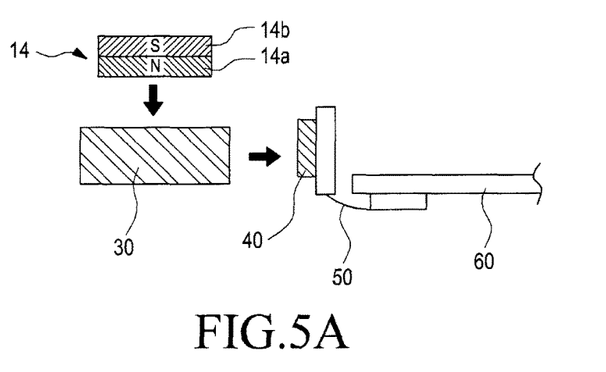
FIG. 5A and FIG. 5B are views showing a magnet member, a magnetic body, and a Hall sensor when a cover member is folded to a display unit in the electronic device of FIG. 4.
Figure 5B:
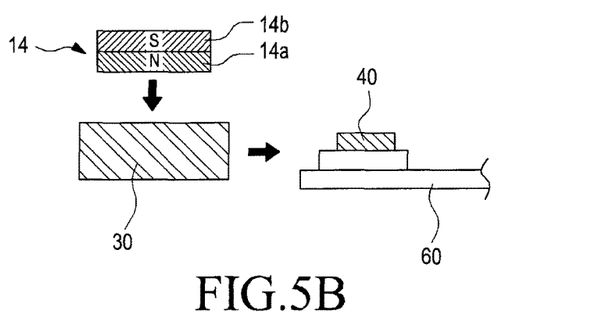
Figure 7A:
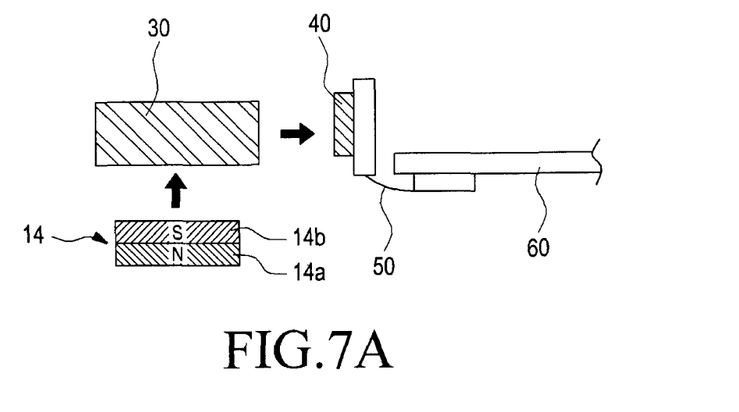
FIG. 7A and FIG. 7B are views showing a magnet member, a magnetic body, and a Hall sensor when the cover member is folded to a rear surface of the body in the electronic device of FIG. 6.
Figure 7B:
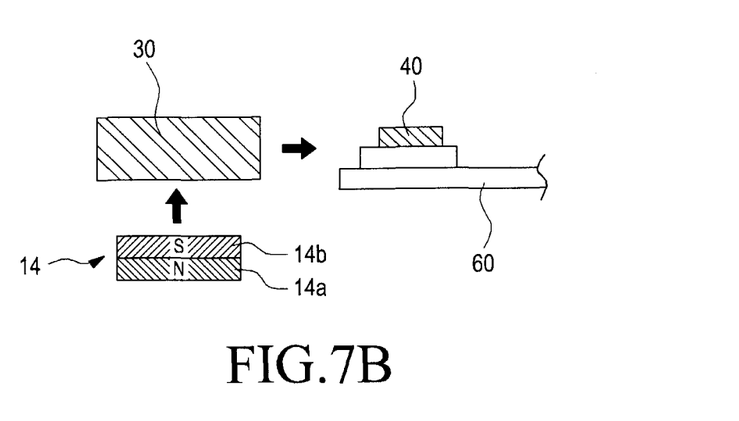

The magnetic body 30 is preferably formed of a ferromagnetic substance such as iron, nickel or cobalt such that it can be magnetized by the magnet member 14. The sensor unit 40 is most often mounted inside the body 20, and is disposed at a location close to the magnetic body 30 to sense a magnetic flux of the magnetic body 30. The sensor unit 40 may include at least one of a terrestrial magnetism sensor and a magnetic sensor capable of sensing a magnetic flux. For reference, the terrestrial magnetism sensor is a sensor for detecting a terrestrial magnetism, and is a sensor by which a direction of a magnetism can be directly recognized and a magnitude of the magnetism can be recognized by a period of vibration. Further, the magnetism sensor is a sensor for detecting a magnetic signal, and includes a magnetic needle, a coil magnetic sensor, a solid magnetic sensor, a resonant magnetic sensor. In the embodiment which will be described below, it will be described that the sensor unit 40 is a Hall sensor 40 pertaining to a solid magnetic sensor. However, the sensor unit 40 is not limited to a Hall sensor 40, and any configuration by which a polarity and a magnitude of the polarity can be detected can be arbitrarily chosen. The sensor unit 40 (hereinafter, referred to as 'the Hall sensor 40') is preferably electrically connected to an internal circuit board 60 provided in the body 20, and is electrically connected to the internal circuit board 60 through a circuit board 50, which is typically flexible (FIGS. 5A and 7A). However, the Hall sensor 40 may be directly mounted on the internal circuit board 60 (FIGS. 5B and 7B). The controller 70 controls the device 100 such that a user environment or a set mode, for example, a sleep mode M 1, a standby mode M2, or a stand mode M3 is executed according to a signal output of the Hall sensor 40 having sensed a magnetic flux of the magnetized magnetic body 30 (see FIG. 9).

FIG. 5 is a view showing a magnet member 14, a magnetic body 30, and a Hall sensor 40 when a cover member is folded to a display unit in the electronic device of FIG. 4. The magnet member 14, the magnetic body 30, and the Hall sensor 40 are typically located at a periphery of one side of the body 20. For example, the magnet member 14 is located at a periphery of one side of the cover member 11, and the magnetic body 30 and the Hall sensor 40 are located at a periphery of an inner side of the body 20. If the cover member 11 is folded to the display unit 21 provided on the front surface of the body 20 (see FIGS. 4 and 5), either the N pole 14a or the S pole 14b of the magnet member 14 is brought close to the magnetic body 30. More particularly, if the N pole 14a of the magnet member 14 faces the magnetic body 30 while the cover member 11 is folded to the display unit 21, the S pole 14b of the magnet member 14 is close to the magnetic body 30 while the cover member 11 is folded to the battery cover 12. Accordingly, if the S pole 14b of the magnet member 14 faces the magnetic body 30 while the cover member 11 is folded to the display unit 21, the N pole 14a of the magnet member 14 gets close to the magnetic body 30 while the cover member 11 is folded to the battery cover 12. In other words, whichever pole of the magnet member 14 is near the magnetic body 30 when the cover member is folded to the battery cover of the body 20, the opposite pole will be near the magnetic body 30 when the cover member 11 is folded onto the display unit 21.

Accordingly, the magnetic body 30 reacts with the N pole 14a of the magnet member 14 to generate an attractive force, and the cover member 11 is biased or held to the front surface of the display unit 21. Thus, the cover 11 is held to the front surface of the device 100 without installing a separate fixing unit and the magnet member 14 and the magnetic body 30 are not exposed to the outside in the aspect of design, realizing a luxuriousness of design of the cover unit 10.

The magnetic body 30 facing the N pole 14a of the magnet member 14 is magnetized to generate a magnetic flux. The Hall sensor 40 close to the magnetic body 30 senses the magnetic flux of the magnetized magnetic body 30, indirectly sensing the proximity of the N pole 14a is near. Accordingly, through the Hall sensor 40, the controller 70 recognizes that the cover member 11 is folded to the front surface of the display unit 21 by using the sensed value of the Hall sensor 40, and controls the device 100 to be operated, for example, in the sleep mode M1 according to the folded state (see FIG. 9).

If the cover member 11 is removed from the front surface of the body 20, the magnet member 14 becomes distant from the magnetic body 30. Thus, the magnetic flux of the magnetic body 30 is changed. The Hall sensor 40 senses that the N pole 14a of the magnet member 14 has been removed. Thus, the controller 70 recognizes that the cover member 11 is opened, and executes, e.g., the standby mode M2 (see FIG. 9). In one embodiment, in the standby mode M2, as a user directly touches the display unit 21 to enter input, various functions can be executed.

Figure 6:
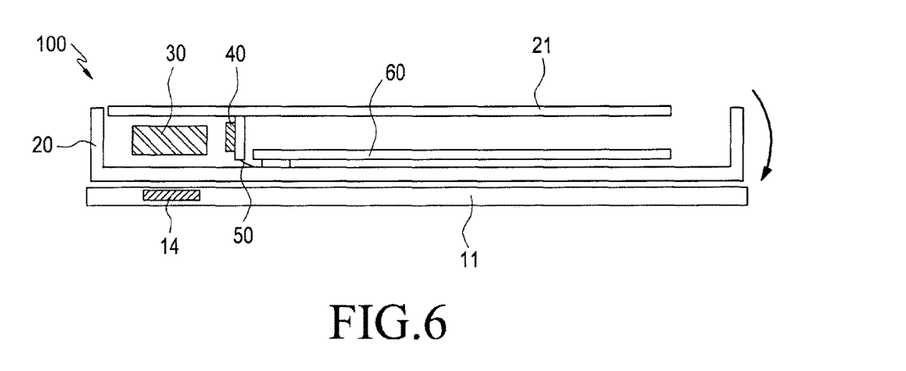
FIG. 6 is a view showing a state in which the cover member is folded to a rear surface of the body in the electronic device of FIG. 4.

FIG. 6 is a view showing a state in which the cover member 11 is folded to a rear surface of the body in the electronic device 100 of FIG. 4. FIG. 7 is a view showing a magnet member 14, a magnetic body 30, and a Hall sensor 40 when the cover member 11 is folded to a rear surface of the body 20 in the electronic device 100 of FIG. 6. Referring to FIGS. 6 and 7, if the cover member 11 is rotated by 360 degrees such that it is folded to the rear surface of the body 20, for example, the rear surface of the battery cover 12, a polarity opposite to the polarity having faced the magnetic body 30 on the front surface of the body 20 faces the magnetic body 30. More particularly, as mentioned above, if the N pole 14a of the magnet member 14 faces the magnetic body 30 while the cover member 11 is folded to the display unit 21, the S pole 14b of the magnet member 14 gets close to the magnetic body 30 while the cover member 11 is folded to the battery cover 12. Similarly, if the S pole 14b of the magnet member 14 faces the magnetic body 30 while the cover member 11 is folded to the display unit 21, the N pole 14a of the magnet member 14 gets close to the magnetic body 30 while the cover member 11 is folded to the battery cover 12.

For example, if the N pole 14a of the magnet member 14 faces the magnetic body 30 while the cover member 11 is folded to the display unit 21, the S pole 14b of the magnet member 14 faces the magnetic body 30 while the cover member 11 is folded to the battery cover 12(FIGS. 5A and 5B). Accordingly, an attractive force is generated between the S pole 14b of the magnet member 14 and the magnetic body 30 so that the cover member 11 is held while being folded to the rear surface of the body 20, for example, the battery cover 12. Since the cover member 11 is held to the battery cover 12 even if it is not fixed separately, a convenience of user can be improved. The magnetic body 30 is magnetized by the S pole 14b to generate a magnetic flux. The Hall sensor 40 senses a magnetic flux of the magnetic body 30 magnetized by the S pole 14b, and accordingly, the controller 70 becomes aware that the cover member 11 is folded to the rear surface of the body 20, that is, the battery cover 12. Accordingly, the device 100 can continuously maintain the standby mode M2 (see FIG. 9).

FIG. 8 is a view showing a case when the cover member 11 holds the body in the device 100 of FIG. 4 at an angle. Referring to FIG. 8, the cover member 11 may have a plurality of division parts 11a, 11b, and 11c so that the body 20 can be maintained in such a position. In this embodiment, three division parts 11a, 11b, and 11c are formed such that the division parts 11a, 11b, and 11c can be rotated and fixed with respect to each other to hold the body 20. Accordingly, the body 20 is held at a predetermined angle by the cover member 11. While the cover member 11 holds the body 20, the magnet member 14 and the magnetic body 30 are spaced from each other by a predetermined interval D. If the cover member 11 is divided to hold the body 20 at least two different angles, the interval D between the magnet member 14 and the magnetic body 30 will be different according to the holding angles. The magnetic body 30 is magnetized by the magnet member 14, but generates a magnetic flux different from the magnetic flux in the folded state. That is, the magnetic body 30 is magnetized weakly in proportional to the spaced distance between the magnet member 14 and the magnetic body 30, and the magnetic flux is sensed by the Hall sensor 40. Accordingly, the Hall sensor 40 senses a magnetic flux of the magnetic body 30 to become aware that the body 20 is held at a predetermined angle due to the sensed value. The controller 70 controls such that the stand mode M3 in which the body 20 can be used while being held can be executed (see FIG. 9). For example, a state in which the body 20 is held is displayed at one side of the screen of the display unit 21 through an alarm such as 'stand' so that a user environment according to the stand mode M3 can be executed. In detail, for example, a video play application capable of reproducing a video is automatically executed or an application set by a user is directly executed to execute a user experience. Further, for example, when a video is played back, a pause, a fast-forward, a section search function, and the like can be executed by applying a motion recognition function. In addition, when a function such as an E-book is executed, a page turning function is executed by applying a motion recognition function. Additionally, various functions can be executed without a touch operation in the stand mode M3 by providing a voice recognition function. In addition, shortcuts of frequently used applications such as a clock, a movie, or a music or a menu bar such as a mini band can be provided. Note that a value of the magnetic flux is changed according to an interval D between a Hall sensor and a magnetic body, and the holding angles. Also, the hall sensor of the present invention detects only one polarity as well as both of the anode and the magnetic flux depending on a distance between the magnetic body 30 and the magnet member 14. Thus, the hall sensor is sensitive enough to detect difference in the magnetic flux.

As described above, if the cover member 11 is located on the front or rear surface of the body 20, the magnetic body 30 fixes the cover member 11 while the cover member 11 is folded to the front or rear surface of the body 20 by an attractive force between the N pole 14a and the S pole 14b of the magnet member 14. It can be seen that the body 20 can be held at a predetermined angle when the cover member 11 is divided into a plurality of division parts 11a, 11b, and 11c.

Figure 9:
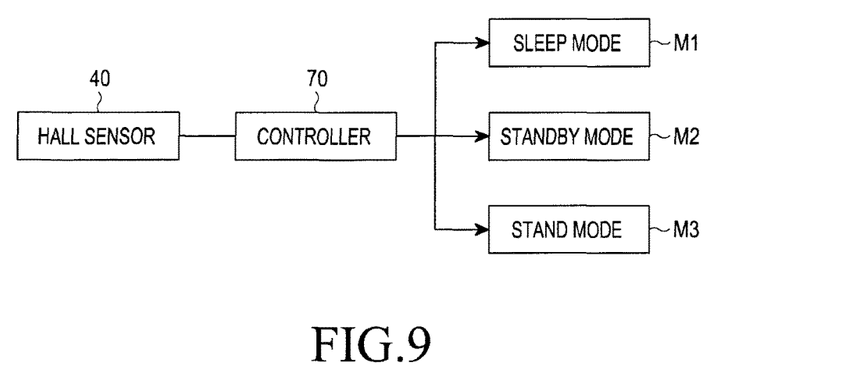
FIG. 9 is a block diagram showing that the electronic device of FIG. 4 is controlled according to a detection of a Hall sensor.

FIG. 9 is a block diagram showing that the electronic device of FIG. 4 can be controlled according to a detection of the Hall sensor 40. The Hall sensor 40 senses a folded location of the cover member 11 according to a magnetic force and a magnetic flux of the magnetic body 30 magnetized by the N pole 14a and the S pole 14b of the magnet member 14. The controller 70 can control the body 20 to execute the standby mode M2, the sleep mode M1, or the stand mode M3, which will be described below, and a user experience can be executed according to the mode.

Figure 10:
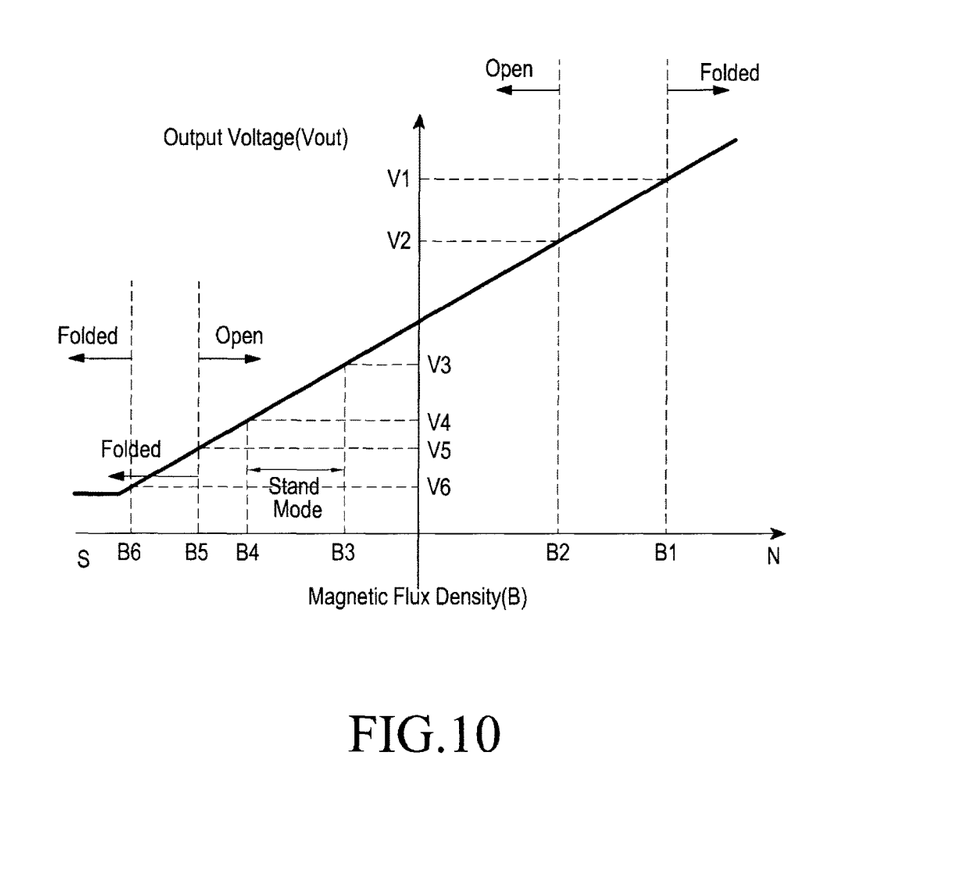
FIG. 10 is a view showing a magnetic flux sensed by a Hall sensor according to opening/closing of the cover member in the electronic device of FIG. 4.
Figure 11:
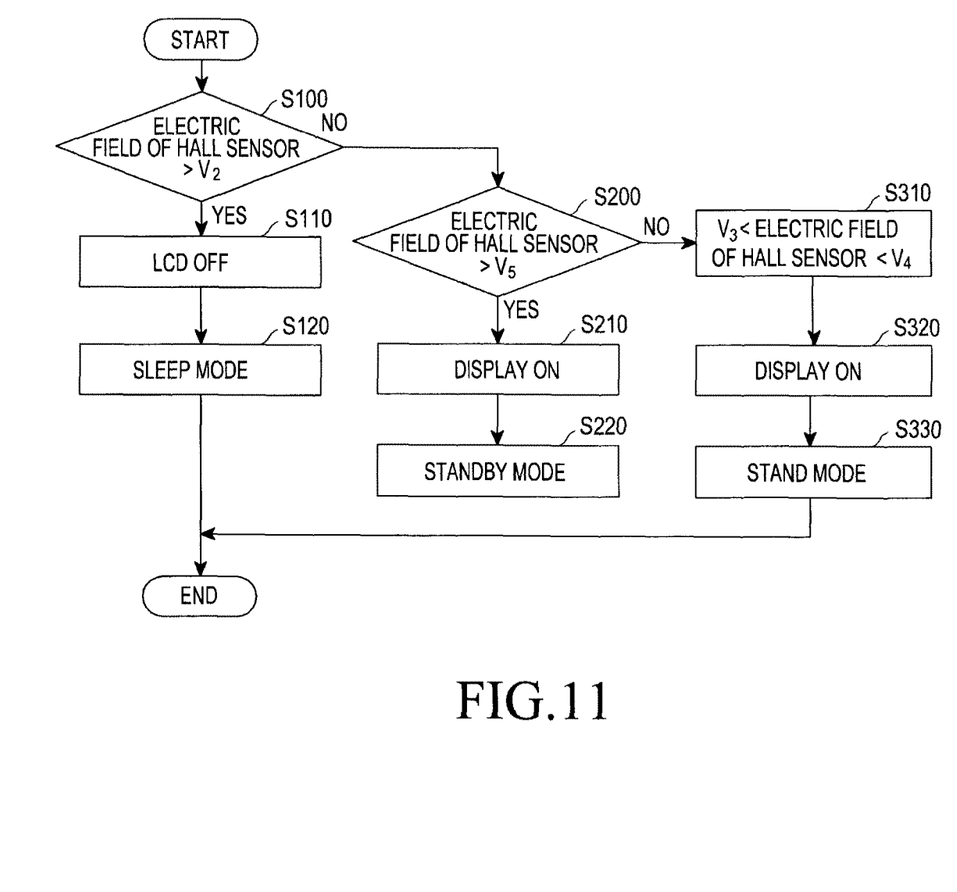
FIG. 11 is a view showing a flowchart showing a driving operation of the electronic device of FIG. 4 according to the magnet member, the magnetic body, and the Hall sensor.

FIG. 10 is a view showing a magnetic flux sensed by a Hall sensor 40 according to opening/closing of the cover member 11 in the electronic device 100 of FIG. 4. FIG. 11 is a view showing a flowchart showing a driving operation of the electronic device 100 of FIG. 4 according to the relative positions of the magnet member 14, the magnetic body 30, and the resulting output of the Hall sensor 40. Referring to FIGS. 10 and 11, as mentioned above, the Hall sensor 40 determines a magnetic flux of the magnetized magnetic body 30, and senses whether the electric field value pertains to the N pole 14a or the S pole 14b (S100). More particularly, when the magnetic flux density (B) sensed by the Hall sensor 40 is larger than V2 of FIG. 10 or smaller than V5, for example, the value is V1 or V6, the controller 70 becomes "aware" that the cover member 11 is folded to the body 20 (FIG. 4), i.e., that the cover member 11 is covering the display unit 21. More particularly, as in FIG. 5 discussed above, while the cover member 11 is folded to the front surface of the body 20, the Hall sensor 40 has a value above the electric field value V2 of the magnetic body 30 magnetized by the magnetic force of the N pole 14a of the magnet member 14, in detail, a value of V1. The controller 70 recognizes that the cover member 11 is folded to the front surface of the display unit 21, and accordingly, the display unit 21 controls such that the power source is turned off (S110) and the body 20 is driven in a sleep mode M1 (S120).

Further, while the cover 11 is folded to the rear surface of the body 20, exposing the display unit 21 (FIG. 6), the Hall sensor 40 has a value below the electric field value V5 of the magnetic body 30 magnetized by the magnetic force of the S pole 14b of the magnet member 14, for example, a value of V6. Accordingly, when the electric field value of the Hall sensor 40 is a value below V5 (S200), the controller 70 recognizes that the cover member 11 is folded to the rear surface of the display unit 21, maintains a state in which the display unit 21 is turned on, and controls the body 20 to execute the standby mode M2 so that the user can use the device 100 (S220).

If the cover member 11 is rotated while being folded to the front or rear surface of the body 20, the magnet member 14 becomes distant from the magnetic body 30 and a magnetic flux recognized by the Hall sensor 40 becomes weak. Then, if the value sensed by the Hall sensor 40 is located on the right side of the graph with respect to Vout0, the Hall sensor 40 recognizes a magnetic flux of the N pole 14a, and if the value is located on the left side of the graph, the Hall sensor 40 recognizes a magnetic flux of the S pole 14b. Accordingly, if the cover member 11 is opened to be moved to the rear surface of the body 20, the sensed magnetic flux value of the Hall sensor 40 is changed from the N pole 14a to the S pole 14b, and if the cover member 11 is be moved to the front surface of the body 20, the sensed magnetic flux value of the Hall sensor 40 is changed from the S pole 14b to the N pole 14a. The controller 70 may determine whether the cover member 11 is rotated in a direction in which the cover member 11 covers or opens the front surface of the body 20 according to the value sensed by the Hall sensor 40 with reference to the Vout0, and may set the mode of the device 100 or execute a set user environment according to the determination.

If the Hall sensor 40 detects that the magnetic flux of the magnetic body 30 is changed by the N pole 14a or the S pole 14b, more particularly, the magnetic flux of the N pole 14a or the S pole 14b is lowered, the electric field value of the Hall sensor 40 is varied. First, when the Hall sensor 40 senses the electric field value of V1 while the cover member 11 is folded to the front surface of the body 20 but senses a change in the electric field to a value of below V2, the controller 70 determines that the cover member 11 has been opened, turns on the display unit 21, and sets the standby mode M2 so that the device 100 can be directly used or usable. Further, when the Hall sensor 40 initially senses the electric field value of V6 while the cover member 11 is folded to the rear surface of the body 20, but senses a change in the electric field to value of above V5, the controller 70 determines that the cover member 11 has been or rotated for holding.

Further, since it can be recognized that the cover member 11 is rotated from the body 20 only after the cover member 11 is spaced from the front or rear surface of the body 20 by a predetermined distance or more, generation of a malfunction can be prevented. More particularly, the electric field value of the Hall sensor 40 is between V1 and V2, the controller 70 can determine that the cover member 11 is folded to the front surface of the body 20. Further, if the electric field value of the Hall sensor 40 is between V5 and V6, the controller 70 can determine that the cover member 11 is folded to the rear surface of the body 20. This is caused by a relatively strong magnetic flux density (B) detected by the Hall sensor 40, only of different polarities.

For example, when the cover member 11 holds the body 20 at a predetermined angle as described above with reference to FIG. 8, the Hall sensor 40 maintains a predetermined electric value between V3 and V4. More particularly, when the electric field value sensed by the Hall sensor 40 constantly maintains a predetermined value between V3 and V4 constantly (S310), the controller 70 determines that the cover member 11 is holding the body 20 at a predetermined angle. The controller 70 accordingly operates the stand mode M3 (S330) while the display unit 21 is turned on or activated so that the user can directly use the display unit 21 (S320).

As discussed above, the electronic device 100 according to the embodiment of the present invention preferably includes the magnetic body 30 between the magnet member 14 and the Hall sensor 40 so that the cover member 14 can be fixed to the front and rear surfaces of the body 20, and can execute a user experience in various modes according to the sensed value of the Hall sensor 40 due to the magnetic flux applied to the magnetic body 30.

Meanwhile, in an embodiment of the present invention, the cover unit 10 is preferably a flip cover integrally coupled to the body 20, in detail, a flip cover including the battery cover 12 covering the rear surface of the body 20 and the cover member 11 rotatably formed in the battery cover 12. However, as described above, it is obvious that the rear cover 12 separately surrounding and covering the rear surface of the body 20 provided with the battery cover is provided and accordingly, the cover member 11 is provided in the form of a flip cover rotatably formed in the rear cover 12.

Further, the sensor unit 40 preferably includes the Hall sensor 40. However, as discussed above, it the sensor unit 40 may include any configuration capable of sensing a magnetic flux, in detail, a configuration capable of sensing a polarity and a magnitude of a polarity of the magnet member 14, including various terrestrial magnetism sensors and magnetic sensors, in addition to the Hall sensor 40.

Further, the magnet member 14, the magnetic body 30, and the Hall sensor 40 are preferably formed generally at a location in the bezel area, for example, at a periphery of one side of the body 20 on an opposite side of the location of the connecting member 13. That is, since the remaining area except for the bezel area should generally include a screen (or the display unit 21), that the magnet member 14, the magnetic body 30, and the Hall sensor 40 are preferably formed in the bezel area of the display unit 21.

In the electronic device according to certain embodiments of the present invention, the cover unit integrally formed with the electronic device can open and close the front surface of the device, and recognize a location where the cover unit is folded to the front or rear surface of the device, and a specific mode can be executed according to a location of the cover unit.

Further, when the electronic device is held by the cover unit, an angle or a location where the cover is held can be sensed, and a mode can be executed while the electronic device is held.

Furthermore, when the cover unit is folded to the front or rear surface of the device, the cover unit can remain fixed to the front or rear surface of the device by an attractive force between the magnet member provided in the cover unit and the magnetic body provided on an inner side of the device, and a fixing unit for fixing the cover unit to the device is not exposed to the outside, realizing a luxurious design of the cover unit.

The apparatuses and methods of the disclosure can be implemented in hardware, firmware or as software or computer code that is stored on a non-transitory machine readable medium such as a CD ROM, a RAM, a floppy disk, a hard disk, or a magneto-optical disk or computer code downloaded over a network originally stored on a remote recording medium or a non-transitory machine readable medium and stored on a local non-transitory recording medium, so that the methods described herein are loaded into hardware such as a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "processor" or "microprocessor" constitute hardware in the claimed invention. Under the broadest reasonable interpretation, the appended claims constitute statutory subject matter in compliance with 35 U.S.C. §101 and none of the elements consist of software per se.

While the present invention has been shown and described with reference to certain embodiments thereof, it will be understood by those skilled in the art that various changes in form and details may be made therein without departing from the spirit and scope of the present invention as defined by the appended claims.

What is claimed is:

1. An electronic device comprising:
    a main body;
    a cover assembly comprising a cover member rotatably coupled to one side of the electronic device;
    wherein the cover assembly further includes a magnet at a periphery of the cover member opposite the one side;
    wherein the main body includes a magnetic body at a periphery of the main body opposite the one side and is positioned to be magnetized by the magnet included in the cover when in proximity thereof;
    a sensor located within the main body near the magnetic body to sense a magnetic flux generated by the magnetic body magnetized by the magnet of the cover; and
    one or more processors configured to execute one or more functions in response to a signal output of the sensor,
    wherein the one or more functions are executed based on a strength of the magnetic flux and an angle of the cover member with respect to the one side of the electronic device, and
    wherein the one or more functions include a standby mode and a stand mode according to a detection value of the sensor.

2. The electronic device of claim 1, wherein the electronic device further comprises a display unit disposed in one surface and the cover member is rotatable relative to the electronic device 360 degrees from a first position where the cover member covers the display unit to a second position where the cover member covers an opposite surface of the electronic device.

3. The electronic device of claim 2, wherein the magnet is located at a periphery of the cover member and the magnetic body is located at a periphery of the electronic device facing the magnet, when the cover member covers a surface of the electronic device.

4. The electronic device of claim 2, wherein the magnet comprises a first pole and a second pole and one of the first pole and the second pole faces the magnetic body at a location where the cover member is folded to a front surface of the electronic device;

the second pole faces the magnetic body at a location where the cover member is folded to a rear surface of the electronic device; and wherein the cover member is positioned such that if the magnet faces the magnetic body, the cover member is held in place while being folded to the front or rear surface of the electronic device.

5. The electronic device of claim 4, wherein the sensor is positioned to sense a folded location of the cover member according to a magnitude of magnetic flux density generated by the magnetic body being magnetized by the N or S pole of the magnet.

6. The electronic device of claim 5, wherein the one or more processors is configured to execute the one or more functions according a position of the cover member.

7. The electronic device of claim 5, wherein the one or more functions comprises executing a sleep mode or a standby mode.

8. The electronic device of claim 2, wherein the cover member comprises a plurality of division parts so that a position of the electronic device can be maintained on a surface of the cover member.

9. The electronic device of claim 8, wherein the division parts are configured to be bent with respect to each other to hold the electronic device, such that the magnet and the magnetic body are spaced from each other at a space distance, the magnet and the magnetic body generates a magnetic force that varies according to the space distance, and the sensor senses a holding position of the cover member according to a magnitude of the magnetic force.

10. The electronic device of claim 9, wherein the one or more processors is configured to execute the one or more functions according to the holding position of the cover member.

11. The electronic device of claim 9, wherein a stand mode is executed by the one or more processors when the holding position of the cover member is sensed by the sensor.

12. The electronic device of claim 1, wherein the sensor comprises at least one of a terrestrial magnetism sensor and a magnetic sensor.

13. The electronic device of claim 1, wherein the sensor comprises a Hall sensor.

14. The electronic device of claim 1, wherein the sensor is electrically connected to an internal circuit board provided on an inner side of the electronic device through a flexible circuit board.

15. The electronic device of claim 1, wherein the sensor is directly electrically connected to an internal circuit board provided on an inner side of the electronic device.

16. The electronic device of claim 1, wherein
the one or more processors executes a standby mode when an angle between the electronic device and a portion of the cover assembly connected to the electronic device is within a first range;
the one or more processors execute a sleep mode when the angle between the electronic device and the portion of the cover assembly connected to the electronic device is within a second range; and
the one or more processors execute a stand mode when the angle between the electronic device and the portion of the cover assembly connected to the electronic device is within a third range.

17. An electronic device comprising:
a flip cover comprising a rear cover coupled to a rear surface of the electronic device, a front cover rotatably connected to the rear cover to cover a display unit disposed in the electronic device, a permanent magnet disposed in the front cover at a periphery of the front cover, and a connecting member that is attached to both the rear cover and the front cover at one side opposite the periphery;
a ferromagnetic body positioned in the electronic device at a periphery of the electronic device opposite the one side to face the permanent magnet; and
a Hall sensor positioned in the electronic device and mounted in proximity to the ferromagnetic body to sense a magnetic flux of the ferromagnetic body magnetized by the permanent magnet of the front cover,
wherein the permanent magnet, ferromagnetic body and Hall sensor are positioned such that when the front cover covers the display unit, a first attractive force between a first pole of the permanent magnet and the ferromagnetic body holds the front cover in place,
when the front cover covers the rear cover, a second attractive force between a second pole of the permanent magnet opposite the first pole and the ferromagnetic body holds the front cover in place, and
the Hall sensor senses a folded location of the front cover and a held location of the electronic device through the magnetic flux.

18. The electronic device of claim 17, further comprising one or more processors configured to execute one or more functions base on a corresponding position of the front cover according to a signal output of the Hall sensor, wherein the one or more functions includes a standby mode, and a stand mode according to a detection value of the Hall sensor.

19. A method of operating an electronic device having a cover assembly, the cover assembly having a magnet, and the device having a magnetic body and a Hall sensor located near the magnetic body, and one or more processors, the method comprising:
detecting, with the Hall sensor, values corresponding to polarity and magnitude of magnetism in the magnetic body resulting from its proximity to the magnet, wherein a first polarity is associated with the cover assembly at least partially covering a front surface of the electronic device and a second polarity opposite the first polarity is associated with the cover assembly at least partially covering a rear surface of the electronic device; and
executing, by the one or more processors, one of a plurality of functions, respectively, based on a position of the cover assembly corresponding to one of the detected values between an open position and a closed position of the cover assembly, wherein the one of the plurality of functions is executed based detection of the second polarity and a determination that the magnitude of the magnetism in the magnetic body is within a predetermined range.

20. The method of operating an electronic device of claim 19, wherein the executing comprises at least one of a stand mode, a sleep mode and a standby mode.

21. The method of operating an electronic device of claim 20, wherein:
the standby mode is executed when an angle between the electronic device and a portion of the cover assembly is within a first range;
the sleep mode is executed when the angle between the electronic device and the portion of the cover assembly is within a second range; and the stand mode is executed when the angle between the electronic device and the portion of the cover assembly is within a third range.

* * * * *